United States Patent
Lee et al.

(10) Patent No.: US 8,076,964 B2
(45) Date of Patent: Dec. 13, 2011

(54) SAMPLING CIRCUIT

(75) Inventors: Ji-Wang Lee, Gyeonggi-do (KR);
Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 22 days.

(21) Appl. No.: 12/630,021

(22) Filed: Dec. 3, 2009

(65) Prior Publication Data
US 2011/0001533 A1 Jan. 6, 2011

(30) Foreign Application Priority Data
Jul. 1, 2009 (KR) .......................... 10-2009-0059866

(51) Int. Cl.
*H03K 3/00* (2006.01)
(52) U.S. Cl. ........................................ 327/199; 327/355
(58) Field of Classification Search .................. None
See application file for complete search history.

(56) References Cited

U.S. PATENT DOCUMENTS

| | | | | |
|---|---|---|---|---|
| 5,818,890 A * | 10/1998 | Ford et al. | ...................... | 375/371 |
| 6,563,373 B1 * | 5/2003 | Shou et al. | ..................... | 327/554 |
| 6,765,423 B2 * | 7/2004 | Higuchi | ........................ | 327/270 |
| 7,164,378 B2 * | 1/2007 | Oprescu | ........................ | 341/155 |
| 7,221,723 B2 * | 5/2007 | Walker | .......................... | 375/355 |
| 7,353,419 B1 * | 4/2008 | Liu | ............................... | 713/503 |
| 7,526,395 B2 * | 4/2009 | Sullivan et al. | ................. | 702/79 |
| 7,622,961 B2 * | 11/2009 | Grochowski et al. | ............ | 327/20 |
| 7,760,840 B2 * | 7/2010 | Chang | ........................... | 375/376 |
| 2003/0090307 A1 * | 5/2003 | Shin | ............................. | 327/200 |
| 2005/0134305 A1 * | 6/2005 | Stojanovic et al. | ............. | 326/31 |
| 2005/0271123 A1 * | 12/2005 | Fulghum | ...................... | 375/148 |
| 2007/0220385 A1 * | 9/2007 | Ogawa | .......................... | 714/726 |

FOREIGN PATENT DOCUMENTS

| | | |
|---|---|---|
| KR | 100182981 | 4/1999 |
| KR | 100258855 | 6/2000 |

* cited by examiner

*Primary Examiner* — Cassandra Cox
(74) *Attorney, Agent, or Firm* — IP & T Group LLP

(57) ABSTRACT

A sampling circuit for use in a semiconductor device, includes a first sampling unit configured to sample a data signal in synchronism with a reference clock signal and output a first output signal, a second sampling unit configured to sample a delayed data signal in synchronism with the reference clock signal and output a second output signal, and an output unit configured to combine the first and second output signals and output a sampling data signal.

16 Claims, 6 Drawing Sheets

(A)

(B)

SAMPLING CIRCUIT

CROSS-REFERENCE TO RELATED APPLICATION

The present application claims priority of Korean patent application number 10-2009-0059866, filed on Jul. 1, 2009, the disclosure of which is incorporated herein by reference in its entirety.

BACKGROUND OF THE INVENTION

Exemplary embodiments of the present invention relate to a semiconductor device design technique and more particularly, to a sampling circuit of a semiconductor device.

The sampling operation for a digital signal is performed by detecting a logic level of the digital signal in synchronism with a reference clock. In detail, while performing the sampling operation, it is determined whether the logic level of the digital signal has a logic high level or a logic low level at a certain edge of the reference clock. In order to secure a reliable sampling operation, the digital signal is held valid and constant for specified periods before and after the certain edge of the reference clock, which periods are called the setup time and the hold time, respectively.

FIG. 1 shows graphs illustrating a general sampling operation for a digital signal.

As shown, the digital signal of case (A) maintains a certain logic level for a longer period than that of case (B). The set up time and the hold time are set before and after the certain edge of the reference clock for specified periods, respectively, in both cases (A) and (B). Although FIG. 1 only shows that the sampling operation is performed at a rising edge of the reference clock, it is also possible to perform the sampling operation at a falling edge of the reference clock.

Since the digital signal of case (A) maintains the certain logic level for a relatively longer period, there are sufficient margins before the set up time and after the hold time. Accordingly, the sampling operation to the digital signal of case (A) can be more reliably performed even when the edge of the reference clock moves depending on the process, voltage, and temperature (PVT) conditions.

In case (B), the digital signal holds the certain logic level only for the set up time and the hold time (i.e., without margins). Therefore, it is difficult to perform the sampling operation correctly when the edge of the reference clock moves according to the PVT conditions.

The period where the digital signal maintains the certain level is determined by a frequency of the digital signal. That is, the frequency of the digital signal of case (A) is lower than that of case (B). Currently, the operation speed of the semiconductor device continuously increases and, therefore, the frequency of the digital signal inputted to the semiconductor device is required to be continuously decreased. Accordingly, since the period where the digital signal maintains the valid and constant level continuously decreases, it becomes more difficult to secure the reliable sampling operation for the digital signal and the correct operation of the semiconductor device.

SUMMARY OF THE INVENTION

An embodiment of the present invention is directed to a sampling circuit for performing a reliable sampling operation.

In accordance with an embodiment of the present invention, there is provided a sampling circuit for use in a semiconductor device, including a first sampling unit configured to sample a data signal in synchronism with a reference clock signal and output a first output signal, a second sampling unit configured to sample a delayed data signal in synchronism with the reference clock signal and output a second output signal, and an output unit configured to combine the first and second output signals and output a sampling data signal, wherein the delayed data signal is generated by delaying the data signal for a predetermined time.

In accordance with another embodiment of the present invention, there is provided a sampling circuit for use in a semiconductor device, including a latch unit configured to latch a data signal in synchronism with a first edge of a reference clock signal and output a latched signal, a delay unit configured to delay the latched signal for a predetermined time and output a delayed signal, a first sampling unit configured to sample the latched signal in synchronism with a second edge of the reference clock signal and output a first sampling signal, a second sampling unit configured to sample the delayed signal in synchronism with a second edge of the reference clock signal and output a second sampling signal, and an output unit configured to combine the first and second sampling signal and output a sampling data signal.

In accordance with still another embodiment of the present invention, there is provided a sampling circuit for use in a semiconductor device, including a first sampling unit configured to sample a first data signal in synchronism with a reference clock signal and output a first sampling signal, a second sampling unit configured to a sample a second data signal in synchronism with the reference clock signal and output a second sampling signal, a third sampling unit configured to sample a third data signal in synchronism with the reference clock signal and output a third sampling signal, a fourth sampling unit configured to sample a fourth data signal in synchronism with the reference clock signal and output a fourth sampling signal, and an output unit configured to combine the first to fourth sampling signals and output a sampling data signal, wherein the third and fourth data signals are generated by inverting and delaying the first and second data signals, respectively.

DESCRIPTION OF SPECIFIC EMBODIMENTS

Figure 1:
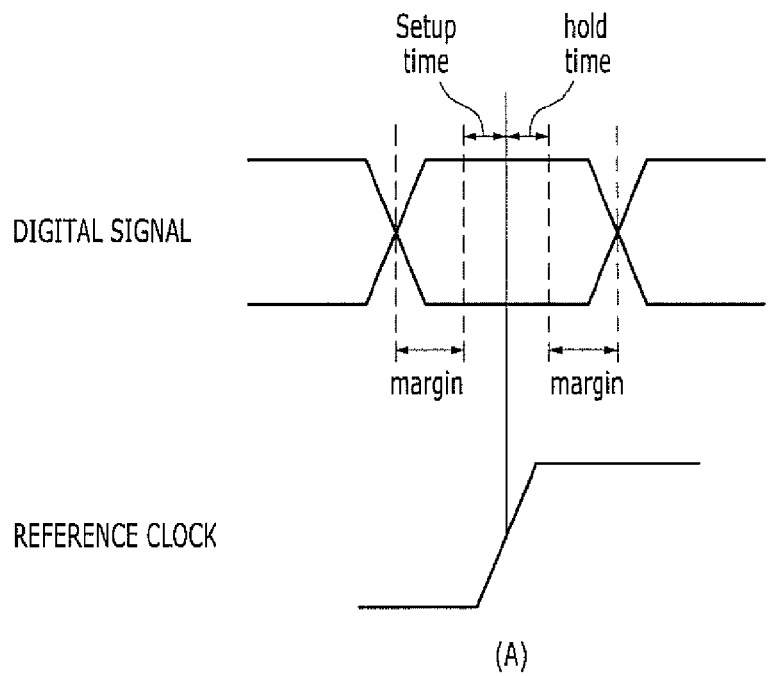
FIG. 1 shows graphs illustrating a general sampling operation for a digital signal.
Figure 1:
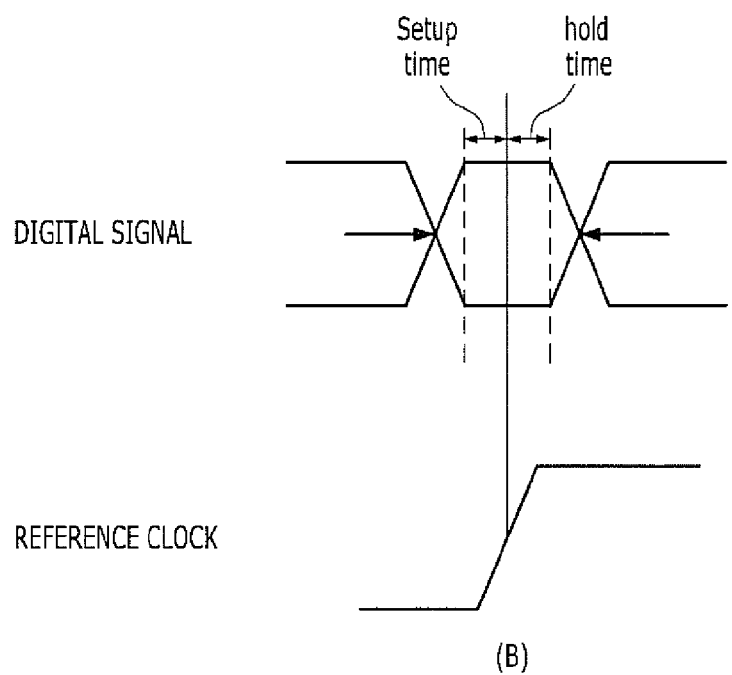

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
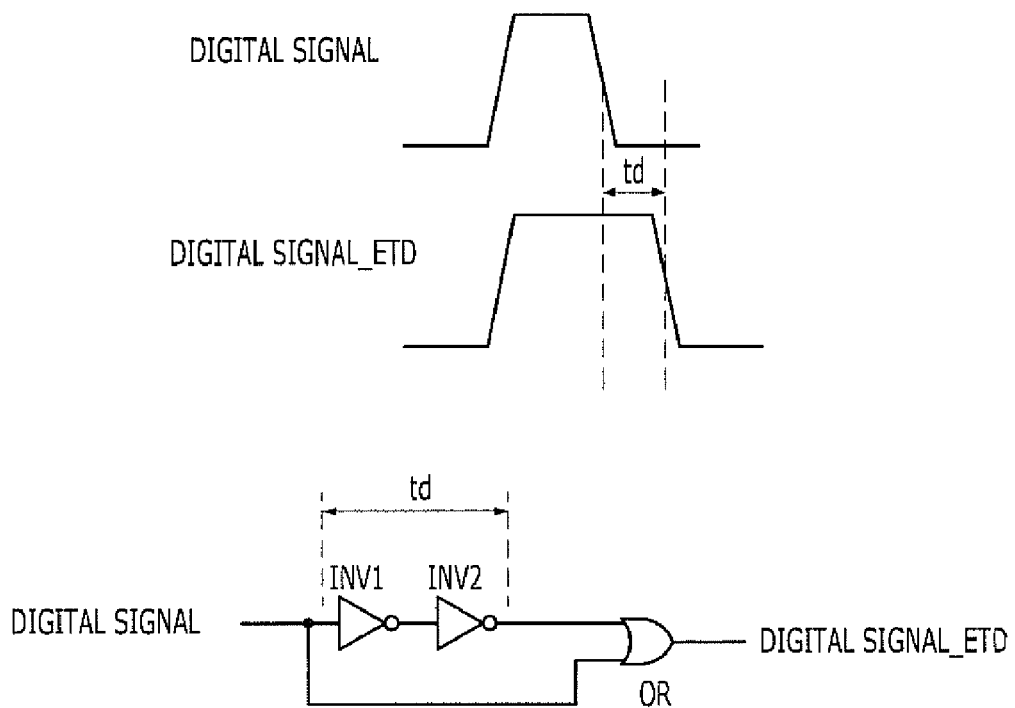
FIG. 2 depicts a circuit for extending a valid period of a digital signal.

FIG. 2 depicts a circuit for extending a valid period of a digital signal.

Since there is no feasible method to detect an input timing of the digital signal DIGITAL SIGNAL in advance, it is difficult to extend a set up time of the digital signal DIGITAL SIGNAL. Accordingly, the valid period of the digital signal DIGITAL SIGNAL can be extended only by extending a hold time. Although the set up time is not extendable, it is possible to obtain the valid period of the digital signal DIGITAL SIGNAL needed to secure a sufficiently reliable sampling operation by extending the hold time.

As shown in FIG. 2, the circuit for extending the valid period of the digital signal DIGITAL SIGNAL includes two inverters INV1 and INV2 and an OR gate OR. The inverters INV1 and INV2 delay the digital signal DIGITAL SIGNAL by a predetermined time td. The OR gate OR outputs an extended digital signal DIGITAL SIGNAL_ETD by performing a logic OR operation to the digital signal DIGITAL SIGNAL and a delayed digital signal outputted from the inverter INV2.

The circuit shown in FIG. 2 delays the falling edge of the digital signal DIGITAL SIGNAL by the predetermined time td and extends the hold time of the digital signal DIGITAL SIGNAL. The valid period of the digital signal DIGITAL SIGNAL is increased by the extended hold time and the reliability of the sampling operation for the digital signal DIGITAL SIGNAL is improved.

Meanwhile, the circuit shown in FIG. 2 extends the hold time only when the digital signal DIGITAL SIGNAL transitions from a logic high level to a logic low level. In other words, the circuit of FIG. 2 does not extend the valid period of the digital signal DIGITAL SIGNAL when the digital signal DIGITAL SIGNAL transitions from the logic low level to the logic high level. In order to extend the hold time when the digital signal DIGITAL SIGNAL transitions from the logic low level to the logic high level, a circuit may be implemented with two inverters for delaying the digital signal DIGITAL SIGNAL, and a NOR gate for performing a logic NOR operation to the digital signal DIGITAL SIGNAL and a delayed digital signal outputted from the inverters.

Thus, it is possible to modify FIG. 2 to extend the valid period of the digital signal DIGITAL SIGNAL by delaying either a rising edge or a falling edge of the digital signal DIGITAL SIGNAL, so long as the edge is predetermined. Accordingly, the circuit is only applied for extending the valid period of the digital signals, e.g., control signals, whose logic level is given in advance. On the contrary, the digital signals, e.g., data signals, whose logic level is variable and unpredictable, cannot be extended by using the circuit of FIG. 2. In order to extend the valid period of the data signals, it is desirable to extend the valid period of the digital signal DIGITAL SIGNAL regardless of the logic level of the digital signal.

Figure 3:
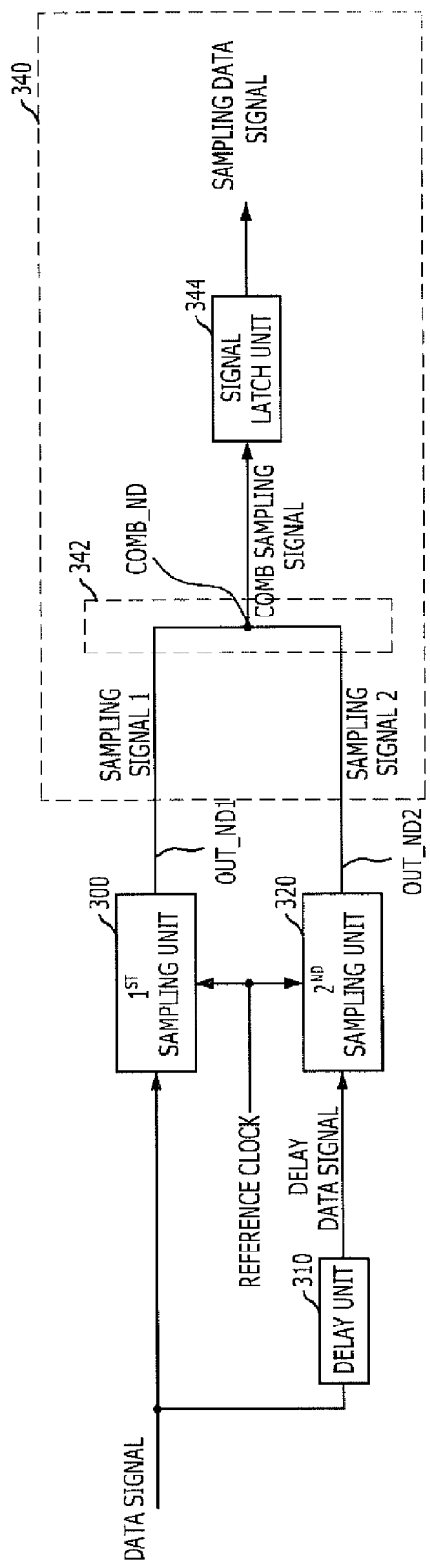
FIG. 3 is a block diagram depicting a sampling circuit for use in a semiconductor device in accordance with an embodiment of the present invention.

FIG. 3 is a block diagram depicting a sampling circuit for use in a semiconductor device in accordance with an embodiment of the present invention.

As shown, the sampling circuit includes first and second sampling units 300 and 320, a delay unit 310 and an output unit 340. The first sampling unit 300 samples a data signal DATA SIGNAL in response to a reference clock signal REFERENCE CLOCK. The delay unit 310 delays the data signal DATA SIGNAL for a predetermined time and outputs a delayed data signal DELAY DATA SIGNAL. The second sampling unit 320 samples the delayed data signal DELAY DATA SIGNAL in response to the reference clock signal REFERENCE CLOCK. The output unit 340 combines an output SAMPLING SIGNAL 1 of the first sampling unit 300 and an output SAMPLING SIGNAL 2 of the second sampling unit 320 and outputs a sampling data signal SAMPLING DATA SIGNAL.

The first sampling unit 300 changes a logic level of the output SAMPLING SIGNAL 1 depending on a logic level of the data signal DATA SIGNAL detected at a first edge of the reference clock signal REFERENCE CLOCK. Herein, the first edge can be a rising edge or a falling edge. The first sampling unit 300 holds the previous logic level of the output SAMPLING SIGNAL 1 regardless of the logic level of the data signal DATA SIGNAL detected at a second edge of the reference clock signal REFERENCE CLOCK. Herein, the second edge has an opposite phase with the first edge. For example, when the first edge is the rising edge, the second edge is the falling edge.

When the data signal DATA SIGNAL has the logic high level at the first edge of the reference clock signal REFERENCE CLOCK, the output SAMPLING SIGNAL 1 becomes the logic high level. On the contrary, when the data signal DATA SIGNAL has the logic low level at the first edge of the reference clock signal REFERENCE CLOCK, the output SAMPLING SIGNAL 1 becomes the logic low level. Meanwhile, at the second edge of the reference clock signal REFERENCE CLOCK, the first sampling unit 300 holds the output SAMPLING SIGNAL 1 at the previous logic level regardless of the logic level of the data signal DATA SIGNAL.

The second sampling unit 320 changes a logic level of the output SAMPLING SIGNAL 2 depending on a logic level of the delayed data signal DELAY DATA SIGNAL detected at the first edge of the reference clock signal REFERENCE CLOCK. The second sampling unit 320 does not change the logic level of the output SAMPLING SIGNAL 2 and holds the previous logic level regardless of the logic level of the delayed data signal DELAY DATA SIGNAL detected at the second edge of the reference clock signal REFERENCE CLOCK.

For example, in case that the delayed data signal DELAY DATA SIGNAL has the logic high level at the first edge of the reference clock signal REFERENCE CLOCK, the output SAMPLING SIGNAL 2 becomes the logic high level. When the delayed data signal DELAY DATA SIGNAL has the logic low level at the first edge of the reference clock signal REFERENCE CLOCK, the output SAMPLING SIGNAL 2 becomes the logic low level. Meanwhile, at the second edge of the reference clock signal REFERENCE CLOCK, the output SAMPLING SIGNAL 2 holds the previous logic level regardless of the logic level of the delayed data signal DELAY DATA SIGNAL.

The output unit 340 includes a signal combination unit 342 and a signal latch unit 344. The signal combination unit 342 combines the outputs, SAMPLING SIGNAL 1 and SAMPLING SIGNAL 2, of the first and second sampling units 300 and 320, respectively. The signal latch unit 344 latches an output COMB SAMPLING SIGNAL of the signal combination unit 342 and outputs the sampling data signal SAMPLING DATA SIGNAL. The signal combination unit 342 electrically shorts an output node OUT_ND1 of the first sampling unit 300 and an output node OUT_ND2 of the second sampling unit 320 with a combination node COMB_ND. The signal latch unit 344 determines a logic level of the sampling data signal SAMPLING DATA SIGNAL based on a voltage level of the combination node COMB_ND.

Generally, the edge of the reference clock signal REFERENCE CLOCK for detecting is located in the middle of a data window of the data signal DATA SIGNAL to detect the logic level relatively correctly even when the PVT conditions are changed. Herein, the data window refers to the period that the data signal holds the valid and constant level. By locating the edge of the reference clock signal REFERENCE CLOCK at the middle of the data window of the data signal DATA SIGNAL, it is possible to obtain the maximum timing margin for correctly detecting the logic level of the data signal DATA SIGNAL.

The data signal DATA SIGNAL is inputted to the first sampling unit 300 so that the first edge of the reference clock signal REFERENCE CLOCK for detecting is located at the middle of the data window of the data signal DATA SIGNAL. In this case, the set up time before the first edge of the reference clock signal REFERENCE CLOCK and the hold time after the first edge of the reference clock signal REFERENCE CLOCK are almost equal.

Meanwhile, the second sampling unit 320 receives the delayed data signal DELAY DATA SIGNAL and the reference clock signal REFERENCE CLOCK. Since the delayed data signal DELAY DATA SIGNAL lags behind the data signal DATA SIGNAL by the predetermined time, the first edge of the reference clock signal REFERENCE CLOCK leads the middle point of the data window of the delayed data signal DELAY DATA SIGNAL by the predetermined time. Thus, the data window of the delayed data signal DELAY DATA SIGNAL includes the hold time that is relatively longer than the set up time. In other words, the set up time of the delayed data signal DELAY DATA SIGNAL is shorter than the set up time of the data signal DATA SIGNAL and the hold time of the delayed data signal DELAY DATA SIGNAL is longer than the hold time of the data signal DATA SIGNAL.

The output unit 340 shorts the output node OUT_ND1 of the first sampling unit 300 and the output node OUT_ND2 of the second sampling unit 320 with a combination node COMB_ND, and thus, the detection results of the first sampling unit 300 and the second sampling unit 320 are loaded at the combination node COMB_ND. Therefore, a data window of the output COMB SAMPLING SIGNAL of the signal combination unit 342 is extended by the extended hold time of the delayed data signal DELAY DATA SIGNAL. In other words, the output COMB SAMPLING SIGNAL of the signal combination unit 342 has a data window, which starts at a starting point of the data window of the data signal DATA SIGNAL and finishes at a finishing point of the data window of the delayed data signal DELAY DATA SIGNAL.

Figure 4:
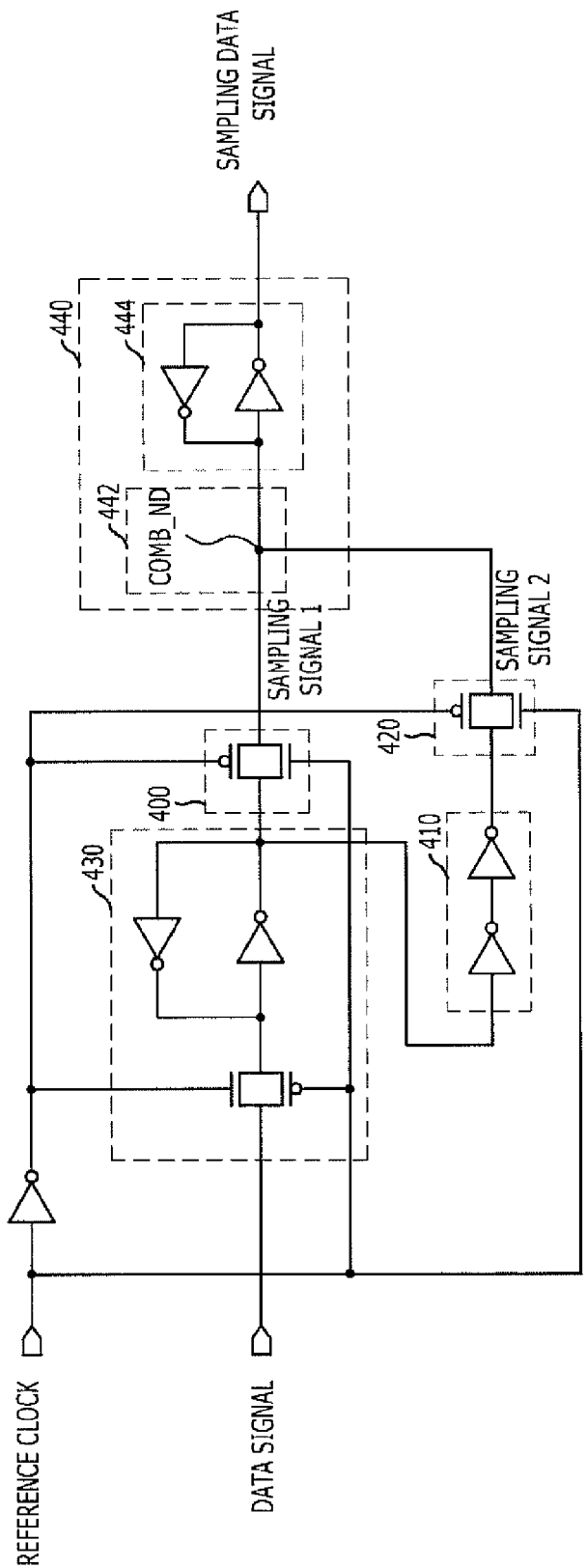
FIG. 4 is a schematic circuit diagram of the sampling circuit employing a single-ended method in accordance with an embodiment of the present invention.

FIG. 4 is a schematic circuit diagram of the sampling circuit employing a single-ended method in accordance with an embodiment of the present invention.

For reference, the circuit diagram of FIG. 4 illustrates an exemplary embodiment of the sampling circuit shown in FIG. 3, but the detailed structure of the sampling circuit can be implemented in various other ways.

As shown in FIG. 4, the sampling circuit using the single-ended method includes a latch unit 430, first and second sampling units 400 and 420, a delay unit 410 and an output unit 440. The latch unit 430 latches the data signal DATA SIGNAL in response to the reference clock signal REFERENCE CLOCK and outputs a latched data. The delay unit 410 delays an output of the latch unit 430 for a predetermined time and outputs a delayed data signal. The first sampling unit 400 samples the data signal DATA SIGNAL in response to the reference clock signal REFERENCE CLOCK and outputs a first output SAMPLING SIGNAL 1. The second sampling unit 420 samples the delayed data signal in response to the reference clock signal REFERENCE CLOCK and outputs a second output SAMPLING SIGNAL 2. The output unit 440 combines the first and second outputs SAMPLING SIGNAL 1 and SAMPLING SIGNAL 2, respectively, and outputs a sampling data signal SAMPLING DATA SIGNAL.

Hereinafter, it is presumed that the reference clock signal REFERENCE CLOCK has a first logic level after occurrence of its first edge and has a second logic level after occurrence of its second edge.

The latch unit 430 changes the logic level of the latched data in response to the data signal DATA SIGNAL when the reference clock signal REFERENCE CLOCK has a logic low level. After a rising edge of the reference clock signal REFERENCE CLOCK, the latch unit 430 holds the previous logic level of the latched data regardless of the logic level of the data signal DATA SIGNAL while the reference clock signal REFERENCE CLOCK has a logic high level.

For example, the latched data outputted from the latch unit 430 has the logic high level when the data signal DATA SIGNAL has the logic high level and the logic low level when the data signal DATA SIGNAL has the logic low level, during a period where the reference clock signal REFERENCE CLOCK has the logic low level. Further, during a period where the reference clock signal REFERENCE CLOCK has the logic high level, the latched data holds its previous logic level regardless of whether the data signal DATA SIGNAL has the logic high level or the logic low level.

The first sampling unit 400 changes the logic level of the first output SAMPLING SIGNAL 1 depending on the logic level of the latched data during a period where the reference clock signal REFERENCE CLOCK has the logic high level. The first sampling unit 400 holds the previous logic level of the first output SAMPLING SIGNAL 1 regardless of the logic level of the latched data during a period where the reference clock signal REFERENCE CLOCK has the logic low level.

For example, the first output SAMPLING SIGNAL 1 has a logic high level when the latched data has the logic high level and a logic low level when the latched data has the logic low level, during a period where the reference clock signal REFERENCE CLOCK has the logic high level. Further, during a period where the reference clock signal REFERENCE CLOCK has the logic low level, the first output SAMPLING SIGNAL 1 holds its previous logic level regardless of whether the latched data has the logic high level or the logic low level.

The second sampling unit 420 changes the logic level of the second output SAMPLING SIGNAL 2 depending on the logic level of the delayed data signal during a period where the reference clock signal REFERENCE CLOCK has the logic high level. The second sampling unit 420 holds the previous logic level of the second output SAMPLING SIGNAL 2 regardless of the logic level of the delayed data signal during the period where the reference clock signal REFERENCE CLOCK has the logic low level.

For example, the second output SAMPLING SIGNAL 2 has the logic high level when the delayed data signal has the logic high level and a logic low level when the delayed data signal has the logic low level, during the period where the reference clock signal REFERENCE CLOCK has the logic high level. Further, during the period where the reference clock signal REFERENCE CLOCK has the logic low level, the second output SAMPLING SIGNAL 2 holds its previous logic level regardless of whether the delayed data signal has the logic high level or the logic low level.

The output unit 440 includes a signal combination unit 442 and a signal latch unit 444. The signal combination unit 442 combines the first and second outputs SAMPLING SIGNAL 1 and SAMPLING SIGNAL 2. The signal latch unit 444 latches an output of the signal combination unit 442 and outputs the sampling data signal SAMPLING DATA SIGNAL. The signal combination unit 442 electrically shorts an output node of the first sampling unit 400 and an output node of the second sampling unit 420 with a combination node COMB_ND. The signal latch unit 444 determines a logic level of the sampling data signal SAMPLING DATA SIGNAL based on a voltage level of the combination node COMB_ND.

Figure 5:
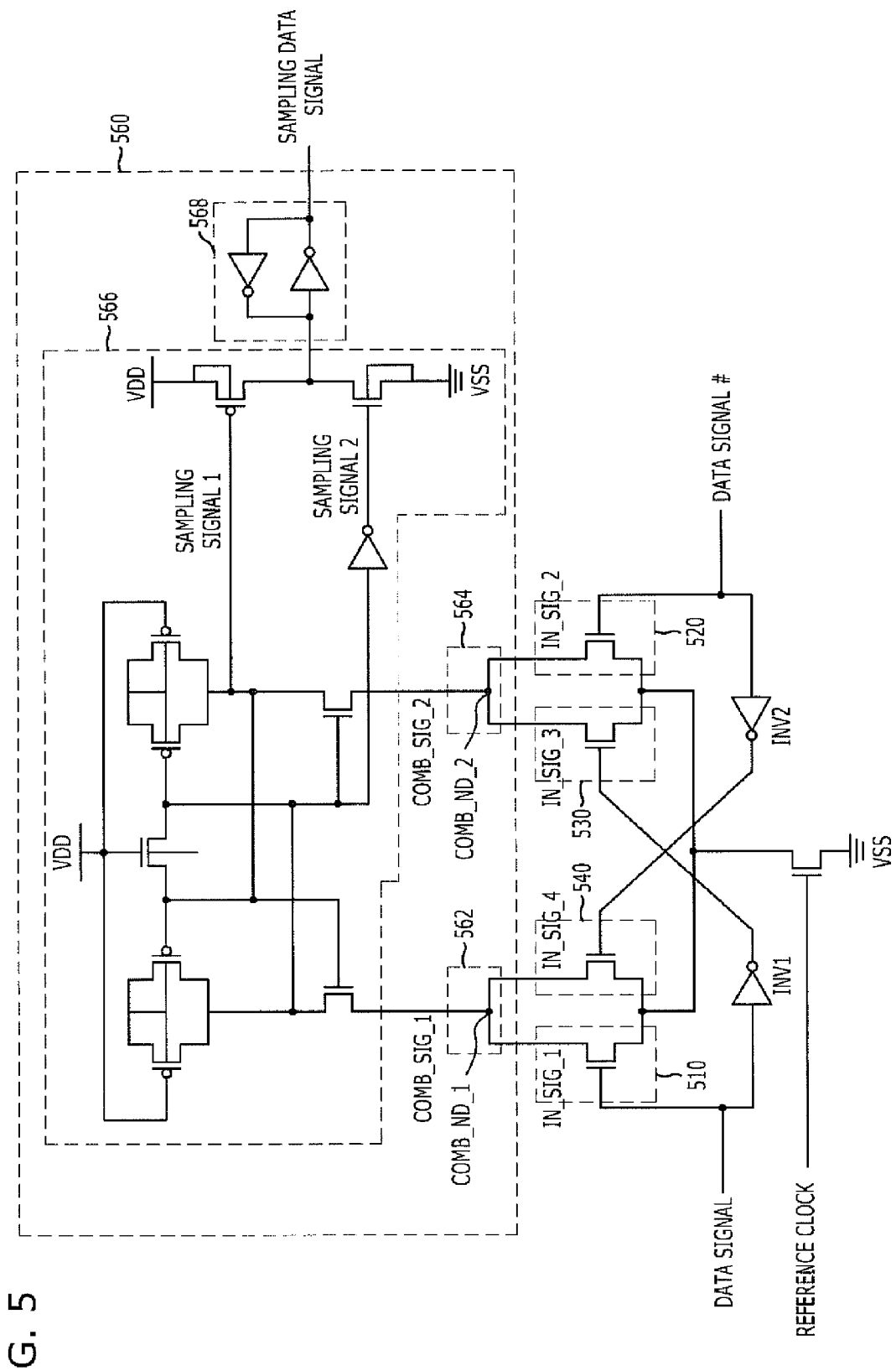
FIG. 5 is a schematic circuit diagram of the sampling circuit employing a differential method in accordance with an embodiment of the present invention.

FIG. 5 is a schematic circuit diagram of the sampling circuit employing a differential method in accordance with an embodiment of the present invention.

For reference, the circuit diagram of FIG. 5 illustrates an embodiment of the sampling circuit shown in FIG. 3, but, the detailed structure of the sampling circuit can be implemented with various other ways.

As shown, the sampling circuit using the differential method includes four sampling units 510, 520, 530 and 540, two inverters INV1 and INV2, and an output unit 560. The first sampling unit 510 samples a first data signal DATA SIGNAL in synchronism with a reference clock signal REFERENCE CLOCK and outputs a first sampling signal IN_SIG_1. The second sampling unit 520 samples a second data signal DATA SIGNAL# (that is, an inverse signal of the DATA SIGNAL) in synchronism with the reference clock signal REFERENCE CLOCK and outputs a second sampling signal IN_SIG_2. The first inverter INV1 inverts the first data signal DATA SIGNAL. The third sampling unit 530 samples an output of the first inverter INV1 and outputs a third sampling signal IN_SIG_3. The second inverter INV2 inverts the second data signal DATA SIGNAL#. The fourth sampling unit 540 samples an output of the second inverter INV2 and outputs a fourth sampling signal IN_SIG_4. The output unit 560 combines the first to fourth sampling signals IN_SIG_1 to IN_SIG_4 and outputs a sampling data signal SAMPLING DATA SIGNAL.

The first sampling unit 510 changes a logic level of the first sampling signal IN_SIG_1 based on a logic level of the first data signal DATA SIGNAL during a period where the reference clock signal REFERENCE CLOCK is activated (i.e., has a logic high level). For example, the first sampling unit 510 decreases a voltage level of the first sampling signal IN_SIG_1 when the first data signal has the logic high level and increases the voltage level of the first sampling signal IN_SIG_1 when the first data signal DATA SIGNAL has the logic low level during the period where the reference clock signal REFERENCE CLOCK is activated (i.e., has the logic high level). Further, during a period where the reference clock signal REFERENCE CLOCK has a logic low level, the first sampling unit 510 holds the previous logic level of the first sampling signal IN_SIG_1 regardless of the logic level of the first data signal DATA SIGNAL.

The second sampling unit 520 changes a logic level of the second sampling signal IN_SIG_2 based on a logic level of the second data signal DATA SIGNAL# during the period where the reference clock signal REFERENCE CLOCK is activated (i.e., has the logic high level). For example, the second sampling unit 520 decreases a voltage level of the second sampling signal IN_SIG_2 when the second data signal DATA SIGNAL# has the logic high level and increases the voltage level of the second sampling signal IN_SIG_2 when the second data signal DATA SIGNAL# has the logic low level during the period where the reference clock signal REFERENCE CLOCK is activated (i.e., has the logic high level). Further, during a period where the reference clock signal REFERENCE CLOCK has the logic low level, the second sampling unit 520 holds the previous logic level of the second sampling signal IN_SIG_2 regardless of the logic level of the second data signal DATA SIGNAL#.

The third sampling unit 530 changes a logic level of the third sampling signal IN_SIG_3 based on a logic level of the output of the first inverter INV1 during the period where the reference clock signal REFERENCE CLOCK is activated (i.e., has the logic high level). Further, during a period where the reference clock signal REFERENCE CLOCK has the logic low level, the third sampling unit 530 holds the previous logic level of the third sampling signal IN_SIG_3 regardless of the logic level of the output of the first inverter INV1.

The fourth sampling unit 540 changes a logic level of the fourth sampling signal IN_SIG_4 based on a logic level of the output of the second inverter INV2 during the period where the reference clock signal REFERENCE CLOCK is activated (i.e., has the logic high level). Further, during a period where the reference clock signal REFERENCE CLOCK has the logic low level, the fourth sampling unit 540 holds the previous logic level of the fourth sampling signal IN_SIG_4 regardless of the logic level of the output of the second inverter INV2.

The output unit 560 includes first and second combination units 562 and 564, a sense amplifying unit 566, and a latch unit 568. The first combination unit 562 combines the first and fourth sampling signals IN_SIG 1 and IN_SIG_4 and outputs a first combined signal COMB_SIG_1 by shorting output nodes of the first and fourth sampling units 510 and 540 with a first combination node COMB_ND_1. The second combination unit 564 combines the second and third sampling signals IN_SIG_2 and IN_SIG_3 and outputs a second combined signal COMB_SIG_2 by shorting output nodes of the second and third sampling units 520 and 530 with a second combination node COMB_ND_2. The sense amplifying unit 566 amplifies a voltage difference between the first and second combined signals COMB_SIG_1 and COMB_SIG_2 in response to the reference clock signal REFERENCE CLOCK and determines the logic level of the sampling data signal SAMPLING DATA SIGNAL. The latch unit 568 latches an output of the sense amplifying unit 566 and outputs the sampling data signal SAMPLING DATA SIGNAL.

The sense amplifying unit 566 changes the logic level the sampling data signal SAMPLING DATA SIGNAL in response to the voltage difference between the first and second combined signals COMB_SIG_1 and COMB_SIG_2 during the period where the reference clock signal REFERENCE CLOCK is activated (i.e., has the logic high level). When the reference clock signal REFERENCE CLOCK is inactivated (i.e., has the logic low level), the sense amplifying unit 566 holds the previous logic level of the sampling data signal SAMPLING DATA SIGNAL by fixing the first and second combined signals COMB_SIG_1 and COMB_SIG_2 to a predetermined voltage level.

For example, the sense amplifying unit 566 changes the logic level of the sampling data signal SAMPLING DATA SIGNAL to the logic high level when the voltage level of the first combination node COMB_ND_1 is lower than that of the second combination node COMB_ND_2 during the period where the reference clock signal REFERENCE CLOCK is activated (i.e., has the logic high level). The sense amplifying unit 566 changes the logic level of the sampling data signal SAMPLING DATA SIGNAL to the logic low level when the voltage level of the first combination node COMB_ND_1 is higher than that of the second combination node COMB_ND_2 during the period where the reference clock signal REFERENCE CLOCK is activated (i.e., has the logic high level).

Figure 6:
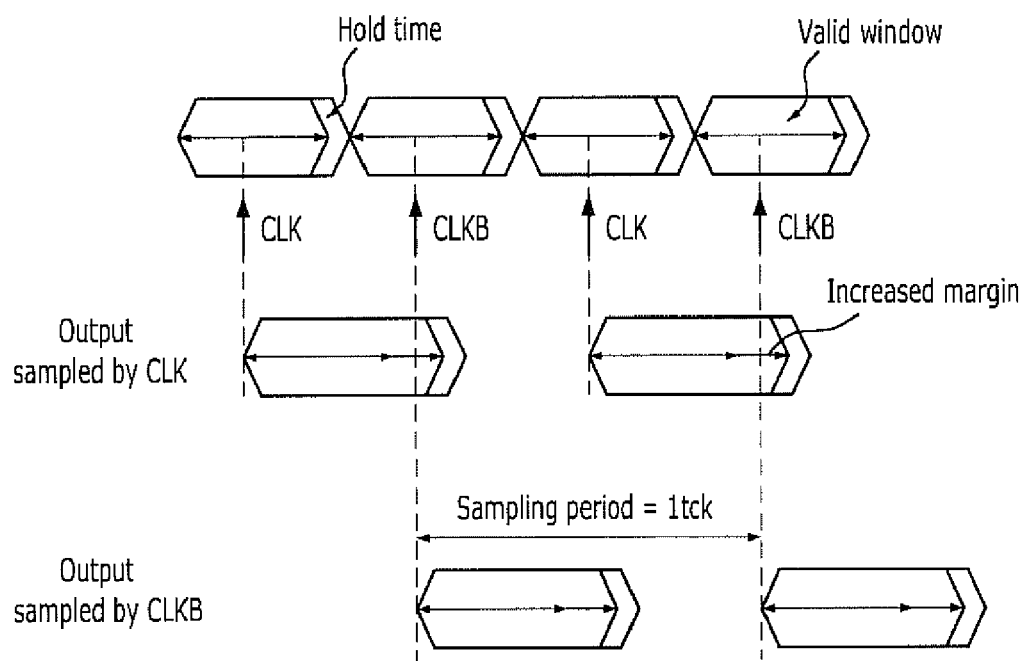
FIG. 6 is a diagram illustrating an operation of the sampling circuit shown in FIGS. 3 to 5.

FIG. 6 is a diagram illustrating an operation of the sampling circuits shown in FIGS. 3 to 5.

As shown, a data window of the data signal is extended by the extended hold time of the delayed data signal. That is, the data signal has the data window, which starts at a starting point of the original data signal and finishes at a finishing point of the data window of the delayed data signal generated by delaying the original data signal for a predetermined time.

Embodiments of the present invention relate to a sampling circuit performing a sampling operation after extending a valid data window by combining a data signal and a delayed data signal. Therefore, the sampling operation is performed reliably and correctly even when the data signal has high frequency.

While the present invention has been described with respect to the specific embodiments, it will be apparent to those skilled in the art that various changes and modifications may be made without departing from the spirit and scope of the invention as defined in the following claims.

What is claimed is:

1. A sampling circuit, comprising:
a first sampling unit configured to sample a data signal in synchronism with a reference clock signal and output a first output signal;
a second sampling unit configured to sample a delayed data signal in synchronism with the reference clock signal and output a second output signal; and
an output unit configured to combine the first and second output signals and output a sampling data signal,
wherein the output unit includes:
a combination unit configured to short output nodes of the first and second sampling units with a combination node; and
a latch unit configured to latch a signal loaded at the combination node and output the sampling data signal.

2. The sampling circuit of claim 1, wherein the first sampling unit is configured to change a logic level of the first output signal depending on a logic level of the data signal detected at a first edge of the reference clock signal, and hold the previous logic level of the first output signal regardless the logic level of the data signal detected at a second edge of the reference clock signal.

3. The sampling circuit of claim 2, wherein the second sampling unit is configured to change a logic level of the second output signal depending on a logic level of the delayed data signal detected at the first edge of the reference clock signal, and hold the previous logic level of the second output signal regardless the logic level of the delayed data signal detected at the second edge of the reference clock signal.

4. A sampling circuit for use in a semiconductor device, comprising:
a latch unit configured to latch a data signal in synchronism with a first edge of a reference clock signal and output a latched signal;
a delay unit configured to delay the latched signal for a predetermined time and output a delayed signal;
a first sampling unit configured to sample the latched signal in synchronism with a second edge of the reference clock signal and output a first sampling signal;
a second sampling unit configured to sample the delayed signal in synchronism with the second edge of the reference clock signal and output a second sampling signal; and
an output unit configured to combine the first and second sampling signals and output a sampling data signal.

5. The sampling circuit of claim 4, wherein the latch unit is configured to change a logic level of the latched signal depending on a logic level of the data signal during a period where the reference clock signal has a first logic level, and hold the previous logic level of the latched signal regardless the logic level of the data signal during a period where the reference voltage clock signal has a second logic level, wherein the reference clock signal has the first logic level after occurrence of the first edge and has the second logic level after occurrence of the second edge.

6. The sampling circuit of claim 5, wherein the first sampling unit is configured to change a logic level of the first sampling signal depending on the logic level of the latched signal during the period where the reference clock signal has the second logic level, and hold the previous logic level of the first sampling signal regardless the logic level of the latched signal during the period where the reference clock signal has the first logic level.

7. The sampling circuit of claim 6, wherein the second sampling unit is configured to change a logic level of the second sampling signal depending on a logic level of the delayed signal during the period where the reference clock signal has the second logic level, and hold the previous logic level of the second sampling signal regardless the logic level of the delayed signal during the period where the reference clock signal has the first logic level.

8. The sampling circuit of claim 4, wherein the output unit includes:
a combination unit configured to short output nodes of the first and second sampling units with a combination node; and
a second latch unit configured to latch a signal loaded at the combination node and output the sampling data signal.

9. A sampling circuit for use in a semiconductor device, comprising:
a first sampling unit configured to sample a first data signal in synchronism with a reference clock signal and output a first sampling signal;
a second sampling unit configured to sample a second data signal in synchronism with the reference clock signal and output a second sampling signal;
a third sampling unit configured to sample a third data signal in synchronism with the reference clock signal and output a third sampling signal;
a fourth sampling unit configured to sample a fourth data signal in synchronism with the reference clock signal and output a fourth sampling signal; and
an output unit configured to combine the first to fourth sampling signals and output a sampling data signal,
wherein the third and fourth data signals are generated by inverting and delaying the first and second data signals, respectively.

10. The sampling circuit of claim 9, wherein the first sampling unit is configured to change a voltage level of the first sampling signal depending on a logic level of the first data signal when the reference clock signal is activated.

11. The sampling circuit of claim 9, wherein the second sampling unit is configured to change a voltage level of the second sampling signal depending on a logic level of the second data signal when the reference clock signal is activated.

12. The sampling circuit of claim 9 wherein the third sampling unit is configured to change a voltage level of the third sampling signal depending on a logic level of the third data signal when the reference clock signal is activated.

13. The sampling circuit of claim 9, wherein the fourth sampling unit is configured to change a voltage level of the fourth sampling signal depending on a logic level of the fourth data signal when the reference clock signal is activated.

14. The sampling circuit of claim 9, wherein the output unit includes:
 a first combination unit configured to combine the first sampling signal and the fourth sampling signal and output a first combination signal;
 a second combination unit configured to combine the second sampling signal and the third sampling signal and output a second combination signal; and
 a sense amplifying unit configured to amplify a voltage difference between the first and second combination signals and determine a logic level of the sampling data signal.

15. The sampling circuit of claim 14, wherein the output unit further comprises a latch unit configured to latch an output of the sense amplifying unit.

16. The sampling circuit of claim 14, wherein the sense amplifying unit is configured to change a logic level of the sampling data signal depending on the voltage difference between the first and second combination signals when the reference clock signal is activated, and hold the sampling data signal at a predetermined logic level when the reference clock signal is inactivated.

* * * * *